(12) United States Patent
Matsunaga et al.

(10) Patent No.: US 8,138,059 B2
(45) Date of Patent: Mar. 20, 2012

(54) SEMICONDUCTOR DEVICE MANUFACTURING METHOD

(75) Inventors: Kentaro Matsunaga, Tokyo (JP); Hirokazu Kato, Wappingers Falls, NY (US); Tomoya Oori, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 176 days.

(21) Appl. No.: 12/564,440

(22) Filed: Sep. 22, 2009

(65) Prior Publication Data
US 2010/0120255 A1 May 13, 2010

(30) Foreign Application Priority Data
Nov. 13, 2008 (JP) .................. 2008-290744

(51) Int. Cl.
*H01L 21/76* (2006.01)
(52) U.S. Cl. ........ 438/424; 438/425; 438/670; 438/671; 438/672; 438/694; 438/696; 438/717; 438/736; 438/737
(58) Field of Classification Search .................. None
See application file for complete search history.

(56) References Cited

U.S. PATENT DOCUMENTS

| | | | | |
|---|---|---|---|---|
| 6,063,688 A * | 5/2000 | Doyle et al. | ......... | 438/424 |
| 6,924,191 B2 | 8/2005 | Liu et al. | | |
| 7,718,540 B2 * | 5/2010 | Tran et al. | ......... | 438/717 |
| 2005/0164478 A1 * | 7/2005 | Chan et al. | ......... | 438/585 |
| 2007/0105054 A1 | 5/2007 | Chiba et al. | | |
| 2008/0299774 A1 * | 12/2008 | Sandhu | ......... | 438/696 |

OTHER PUBLICATIONS

Wolf et al., Silicon Processing for the VLSI Era, vol. 1, 1986, pp. 407-409, 427-429, 434-437, 452-454.*
Shiobara et al., "A Method of Manufacturing a Semiconductor Device", U.S. Appl. No. 12/481,919, filed Jun. 10, 2009.

* cited by examiner

*Primary Examiner* — Duy Deo
(74) *Attorney, Agent, or Firm* — Finnegan, Henderson, Farabow, Garrett & Dunner, L.L.P.

(57) ABSTRACT

A semiconductor device manufacturing method includes: forming a core pattern on a foundation film, the core pattern containing a material generating acid by light exposure; selectively exposing part of the core pattern except an longitudinal end portion; supplying a mask material onto the foundation film so as to cover the core pattern, the mask material being crosslinkable upon supply acid from the core pattern; etching back the mask material to expose an upper surface of the core pattern and remove a portion of the mask material formed on the end portion of the core pattern, thereby leaving a mask material side wall portion formed on a side wall of the core pattern; and removing the core pattern and processing the foundation film by using the mask material sidewall portion left on the foundation film as a mask.

19 Claims, 14 Drawing Sheets

SEMICONDUCTOR DEVICE MANUFACTURING METHOD

CROSS-REFERENCE TO RELATED APPLICATIONS

This application is based upon and claims the benefit of priority from the prior Japanese Patent Application No. 2008-290744, filed on Nov. 13, 2008; the entire contents of which are incorporated herein by reference.

BACKGROUND OF THE INVENTION

1. Field of the Invention

This invention relates to a semiconductor device manufacturing method including patterning using a mask material formed on the sidewall of a core pattern.

2. Background Art

In general, downscaling of a circuit pattern in a semiconductor device requires improvement in exposure wavelength and numerical aperture NA for lithography. As an approach to improvement in numerical aperture NA, the so-called immersion exposure technique is in practical use, which performs light exposure while the space between the objective lens and the semiconductor wafer is filled with pure water. However, the development of device shrinkage is requiring downscaling beyond the resolution limit of immersion exposure systems.

One technique for realizing a finer pattern beyond the limit of such lithography techniques is known as the sidewall transfer process and disclosed in, e.g., U.S. Pat. No. 6,063,688. In this technique, a line pattern serving as a core is formed on a foundation film, and then a mask material made of a different material is formed on the sidewall portion of the line pattern. After the core pattern is removed, the remaining mask material is used as a mask to process the foundation film, thereby forming a fine pattern in the foundation film.

However, in this sidewall transfer process, there is concern about problems resulting from the increased number of process steps, such as increase in line width variation, increase of defects due to particles attached during interprocess transfer, and hence yield decrease.

SUMMARY OF THE INVENTION

According to an aspect of the invention, there is provided a semiconductor device manufacturing method including: forming a core pattern on a foundation film, the core pattern containing a material generating acid by light exposure; selectively exposing part of the core pattern to light; supplying a mask material onto the foundation film so as to cover the core pattern, the mask material being crosslinkable upon supply of acid; removing part of the mask material to expose an upper surface of the core pattern and remove the mask material formed around an unexposed region of the core pattern, thereby leaving a mask material sidewall portion formed on a sidewall of the core pattern; and removing the core pattern and processing the foundation film by using the mask material sidewall portion left on the foundation film as a mask.

DETAILED DESCRIPTION OF THE INVENTION

Embodiments of the invention will now be described with reference to the drawings.

The semiconductor device manufacturing method according to the embodiments of the invention includes the step of processing a foundation film formed on a semiconductor substrate into, for instance, a line-and-space pattern. In the following embodiments, a description is illustratively given of a structure including a silicon oxide film, a carbon film, and an organic antireflective film as foundation films formed on the semiconductor substrate.

First Embodiment

FIGS. 1 to 3 are schematic cross-sectional views showing process steps in a semiconductor device manufacturing method according to a first embodiment of the invention, and FIGS. 4 to 7 are schematic plan views showing major steps in the first embodiment.

Figure 1A:
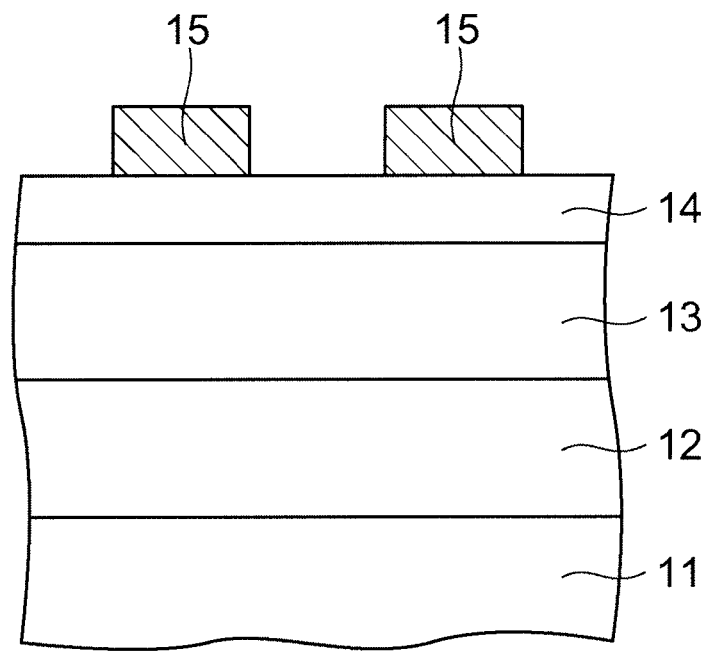
FIGS. 1A and 1B are schematic cross-sectional views showing process steps in a semiconductor device manufacturing method according to a first embodiment of the invention.

First, as shown in FIG. 1A, a silicon oxide film 12 is formed on a semiconductor substrate (such as a silicon substrate) 11 to a thickness of e.g. 200 nm. Subsequently, a carbon film 13 primarily composed of carbon is formed on the silicon oxide film 12 to a thickness of 200 nm illustratively by the CVD (chemical vapor deposition) method. Furthermore, an antireflective film 14 is formed on the carbon film 13. The antireflective film 14 is illustratively an organic antireflective film formed to a thickness of 80 nm. By this antireflective film 14, the reflectance of exposure light at the interface with a resist film to be formed thereon is preferably reduced to 1% or less. Here, the method for forming the carbon film 13 is not limited to the CVD method, but it can be formed by coating.

Next, a resist film is formed on the antireflective film 14 to a thickness of 100 nm. This resist film is a so-called chemically amplified resist, which contains an acid generator generating acid by light exposure, as well as a polymer, an organic solvent and the like.

Figure 4A:
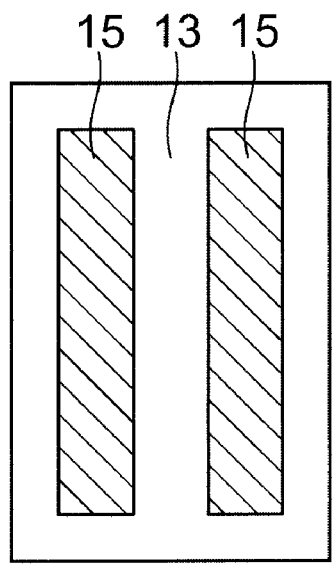
FIGS. 4A and 4B are schematic plan views showing process steps in the semiconductor manufacturing method according to the first embodiment of the invention.

The resist film is exposed to light through a reticle illustratively by an ArF immersion exposure system having a numerical aperture NA of 1.3 or more. Subsequently, PEB (post-exposure bake) and development are performed on a hot plate. Thus, a line-and-space resist pattern 15 having a line width of 40 nm (a pitch of 80 nm) is obtained (FIGS. 1A and 4A). Subsequently, an aqueous solution of acid resin is applied onto the resist pattern 15 and baked on the hot plate at 150° C. for 60 seconds. This resist pattern 15 serves as a core pattern for forming a mask material sidewall portion described later.

The aforementioned resist film is a chemically amplified positive resist. Acid generated in the exposed portion turns the protective group of the polymer insoluble to the developer (e.g., alkali-based) into a soluble group. Hence, the exposed portion of the resist film is dissolved into the developer, and the resist pattern 15 left in a line shape is the unexposed (shielded) portion.

Figure 1B:
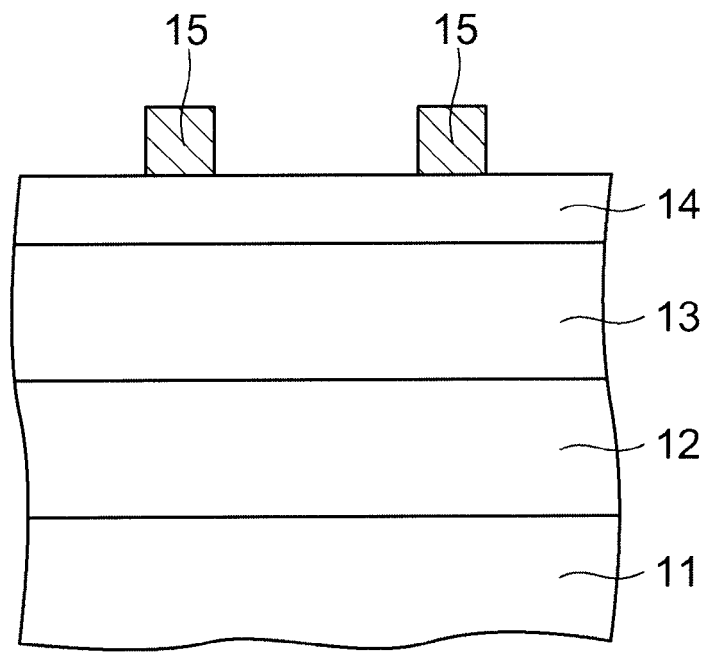
Figure 4B:
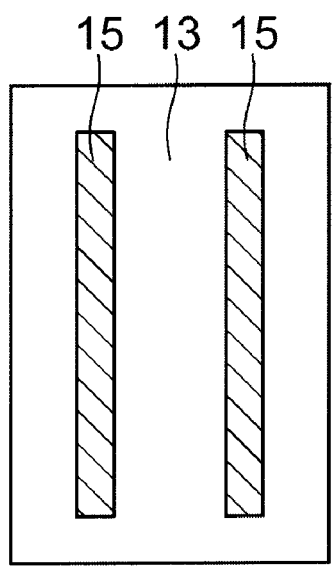

Preferably, the resist pattern 15 obtained by the aforementioned lithography process is subjected, if necessary, to a slimming process, that is, a process for thinning the line width to a desired dimension, before supplying a mask material described later. For instance, in this embodiment, the resist pattern surface is turned alkali-soluble by an acid chemical liquid. Subsequently, it is developed for 30 seconds in a 2.38 wt % TMAH (tetramethylammonium hydroxide) aqueous solution, and then rinsed with pure water, thereby slimming the line width by 20 nm from the state of FIGS. 1A and 4A. This allows the resist pattern 15 to have a line width of 20 nm as shown in FIGS. 1B and 4B.

Alternatively, the resist pattern 15 can be slimmed by partially isotropic etching during dry etching for removing the antireflective film 14. Further alternatively, a line width of 20 nm can be realized by overdose, that is, irradiation with a larger amount of light exposure than the amount of light exposure for providing a line width and a space width at 1:1.

The resist pattern 15 is the portion of the aforementioned resist film which remains by development after light exposure, that is, the unexposed portion which is shielded during the light exposure. Hence, in the resist pattern 15 shown in FIGS. 1B and 4B, no acid is generated, or the amount of acid generation is reduced. In the next step, the resist pattern 15 is selectively exposed to generate acid in the exposed portion.

Figure 5A:
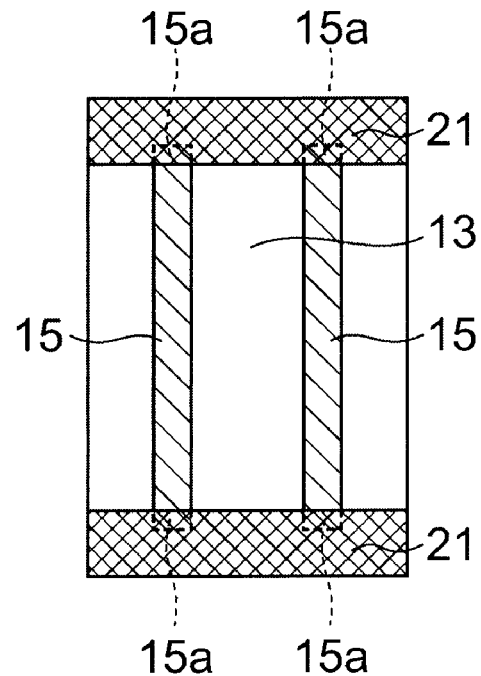
FIGS. 5A and 5B are schematic plan views showing process steps following FIG. 4C.
Figure 5B:
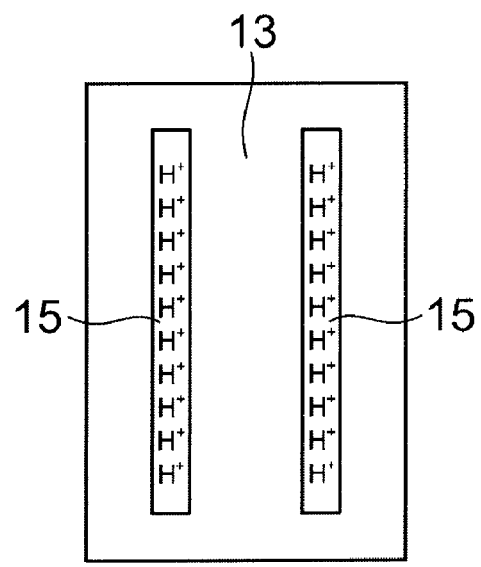

Specifically, as shown in FIG. 5A, in the state where the longitudinal end portion 15a of the line-shaped resist pattern 15 is shielded by a light shielding mask 21, the portion except the end portion 15a is exposed to light. The exposure light can generate acid by reaction with the acid generator contained in the resist pattern 15, and can be suitably selected from g-line, i-line, KrF excimer laser light, ArF excimer laser light, electron beam, EUV (extreme ultraviolet) light, X-ray and the like depending on the resist pattern material. Here, use of the light shielding mask 21 as shown is not necessarily needed to shield the end portion 15a. For instance, in electron beam irradiation, the irradiated region can be easily controlled, and there is no need to use the light shielding mask 21.

This selective light exposure of the resist pattern 15 prevents acid generation in the shielded end portion 15a and allows acid (represented by $H^+$ in FIG. 5B) to be generated in the exposed portion except the end portion 15a. Here, with the increase of the amount of exposure light on the resist pattern 15, the amount of acid generation also increases. After the aforementioned light exposure, baking treatment may be performed.

Figure 2A:
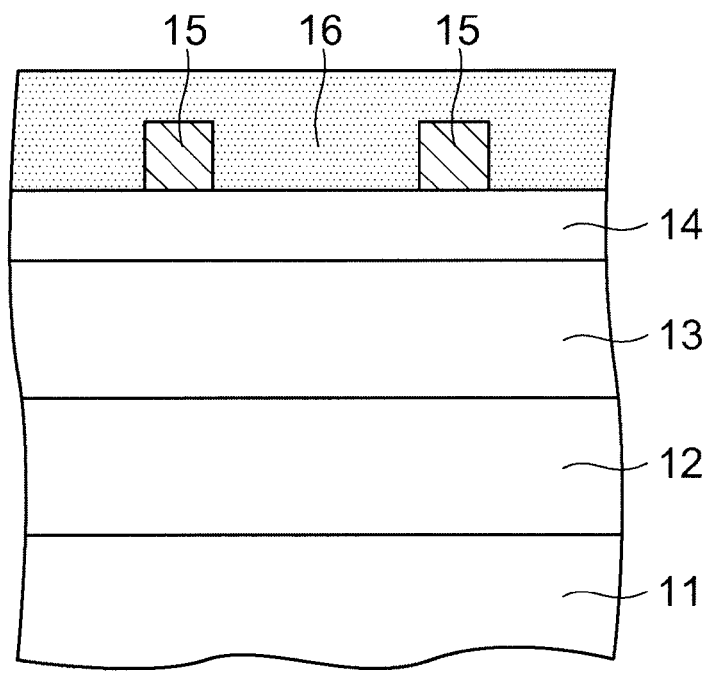
FIGS. 2A and 2B are schematic cross-sectional views showing process steps following FIG. 1B.
Figure 6A:
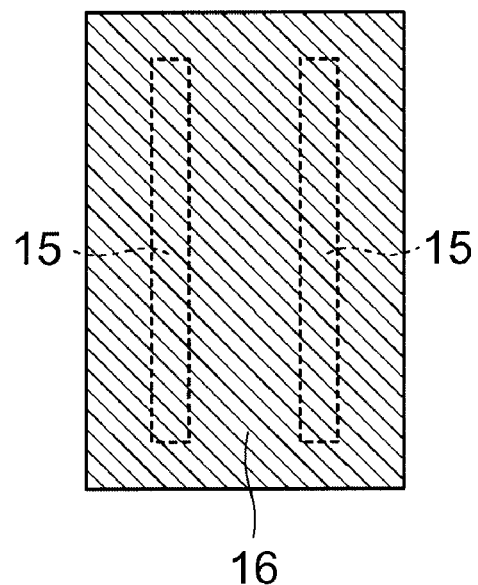
FIGS. 6A and 6B are schematic plan views showing process steps following FIG. 5B.

Next, as shown in FIGS. 2A and 6A, a mask material 16 is supplied onto the carbon film 13 so as to entirely cover the resist pattern 15 including the surroundings of the resist pattern 15. This mask material 16 contains a component which can crosslink upon supply of acid from the resist pattern 15, as well as water, a water-soluble organic solvent and the like. For instance, the mask material 16 is a silicon-containing substance, such as silane compounds (including polysilane compounds), silazane compounds (including polysilazane compounds), siloxane compounds, SOG (spin on glass) materials, and silicon-containing negative resist materials.

In the liquid state with fluidity, the mask material 16 is applied onto the carbon film 13 so as to cover the resist pattern 15, and then cured by baking (heating) treatment. By this baking treatment, acid is supplied from the resist pattern 15 to the mask material 16, initiating a crosslinking reaction from the portion of the mask material 16 in contact with the resist pattern 15, and forming a crosslinked layer at and around the interface between the mask material 16 and the resist pattern 15.

Next, for instance, a thinner is discharged onto the mask material 16 to remove the non-crosslinked portion of the mask material 16. This leaves a mask material crosslinked layer formed on the upper surface of the resist pattern 15 and therearound as shown by hatching in FIG. 6B. Here, the amount of formation of the mask material crosslinked layer around the resist pattern 15 (the amount of protrusion to the surroundings of the resist pattern 15) depends on the amount of acid contained in the resist pattern 15. The amount of acid depends on the amount of light exposure during the aforementioned light exposure in FIG. 5A.

More specifically, there is a small amount of acid in the end portion 15a of the resist pattern 15 shielded during the light exposure, and the crosslinking reaction of the mask material 16 is suppressed in the end portion 15a in such a way that the resist pattern end portion 15a is covered with a very thin mask material crosslinked layer of several nm, for instance. In contrast, on the sidewall of the exposed portion of the resist pattern 15 except the end portion 15a, a mask material crosslinked layer is formed to a thickness corresponding to the amount of light exposure (the amount of protrusion to the surroundings of the resist pattern 15). In this embodiment, the amount of light exposure is adjusted in the aforementioned step so that the thickness of the mask material sidewall portion 16a (the amount of protrusion to the surroundings of the resist pattern 15) is 20 nm, which is equal to the line width of the resist pattern 15. Here, depending on the amount of slimming of the mask material 16 by etch back in the next step, the mask material sidewall portion 16a may be thicker.

Figure 2B:
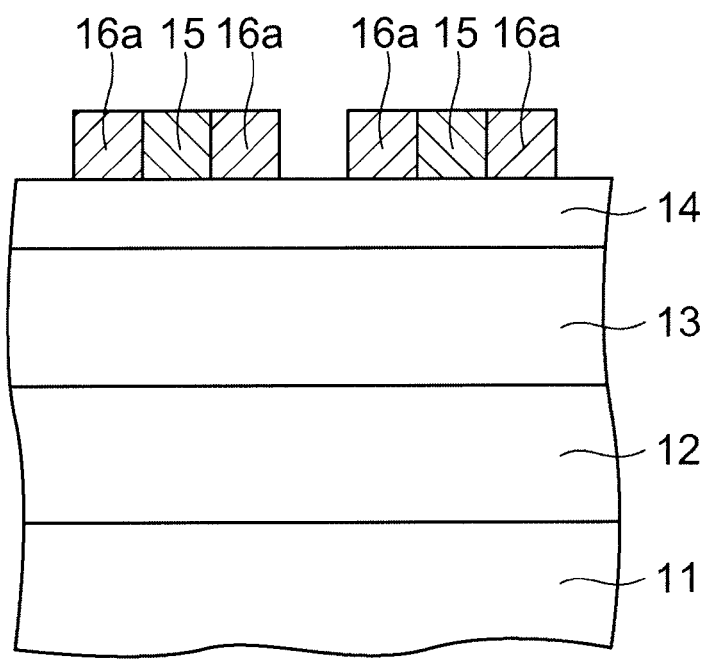
Figure 7A:
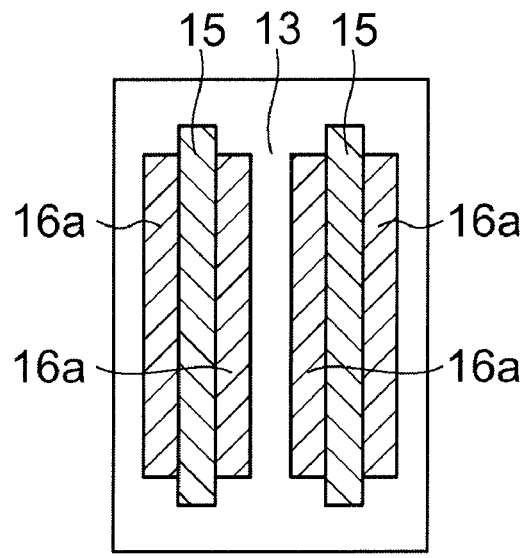
FIGS. 7A and 7B are schematic plan views showing process steps following FIG. 6B.

Next, a fluorocarbon-containing plasma is illustratively used to etch back the mask material (crosslinked layer) 16 by approximately 20 nm to expose the surface (upper surface) of the resist pattern 15 as shown in FIGS. 2B and 7A. Here, the coating thickness of the mask material (crosslinked layer) 16 covering the surroundings of the resist pattern end portion 15a is very thin, such as several nm. Hence, during the step of etching back the mask material, the thin portion is also slimmed and removed. That is, as a result of the removal of the portion formed on the resist pattern end portion 15a, the mask material sidewall portion 16a formed adjacent to the sidewall of each resist pattern 15 is separated into an independent line shape without connection to other mask material sidewall portions 16a as shown in FIG. 7A.

Figure 3A:
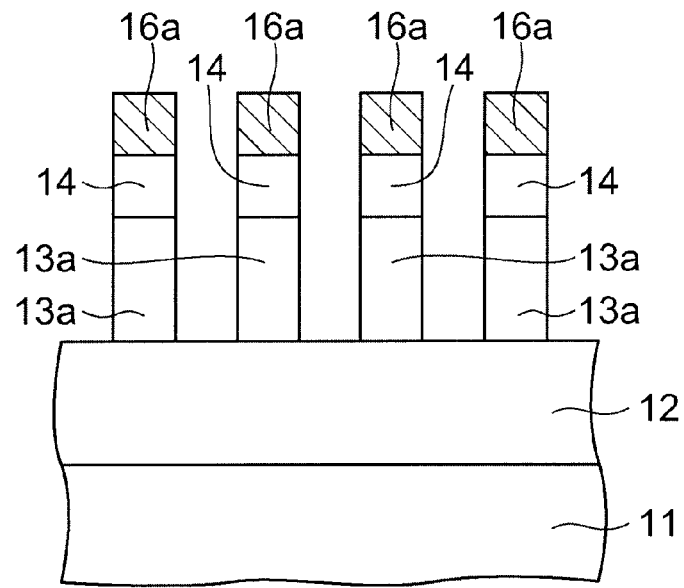
FIGS. 3A to 3C are schematic cross-sectional views showing process steps following FIG. 2B.

Subsequently, the mask material sidewall portion 16a is used as a mask to continuously perform anisotropic etching on the resist pattern 15, the antireflective film 14, and the carbon film 13 with an oxygen-containing plasma. Hence, the portion 13a of the carbon film 13 below the mask material sidewall portion 16a is left on the silicon oxide film 12 as shown in FIG. 3A. Thus, a carbon film pattern 13a, which is a line-and-space pattern with 40 nm pitch (a line width of 20 nm), can be obtained.

Figure 3B:
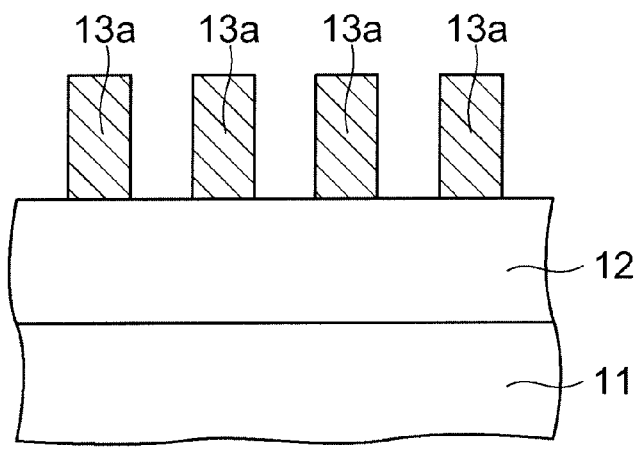
Figure 3C:
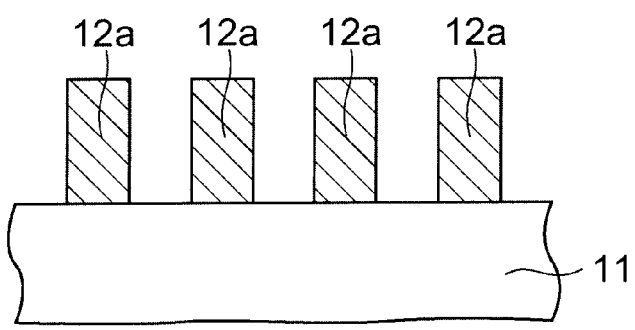
Figure 7B:
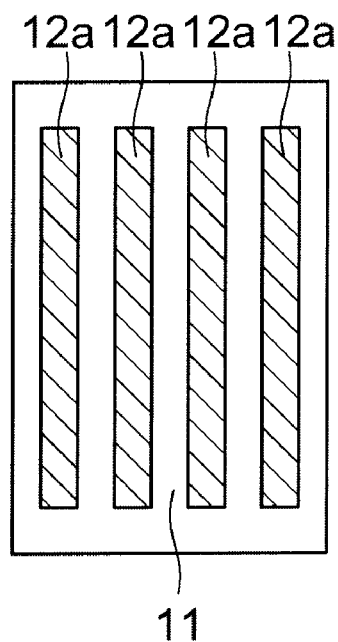

Subsequently, the mask material sidewall portion 16a and the antireflective film 14 therebelow are removed. Then, as shown in FIG. 3B, the carbon film pattern 13a is used as a mask to process the silicon oxide film 12, which is the target film, by dry etching. Subsequently, the carbon film pattern 13a is removed by the oxygen ashing process. Thus, as shown in FIGS. 3C and 7B, a silicon oxide film pattern 12a, which is a line-and-space pattern with 40 nm pitch (a line width of 20 nm), is obtained on the semiconductor substrate 11.

In forming a mask material on the sidewall of the core pattern, it is conventionally difficult to selectively apply the mask material in a line shape only onto the sidewall of the core pattern. Hence, the mask material is first applied so as to entirely cover the core pattern. Here, because the mask material exists so as to cover the surroundings of the core pattern including the longitudinal end portion of the core pattern, the crosslinking reaction of the mask material also occurs entirely in the surroundings of the core pattern, and a mask material crosslinked layer is formed so as to surround the core pattern. To form a line-and-space pattern, the mask material crosslinked layer needs to be formed in a line shape. This separately requires a step for removing the mask material crosslinked layer which is formed around the core pattern end portion so as to connect the mask material sidewall portions formed adjacent to both sidewall portions of the core pattern.

In contrast, in this embodiment, as described above with reference to FIG. 5A, in the step of light exposure for generating acid in the resist pattern 15 serving as the core pattern, the end portion 15a of the resist pattern 15 is shielded so that the end portion 15a is not irradiated with light. Hence, in the end portion 15a, no acid is generated, or the amount of acid generation can be reduced.

Figure 6B:
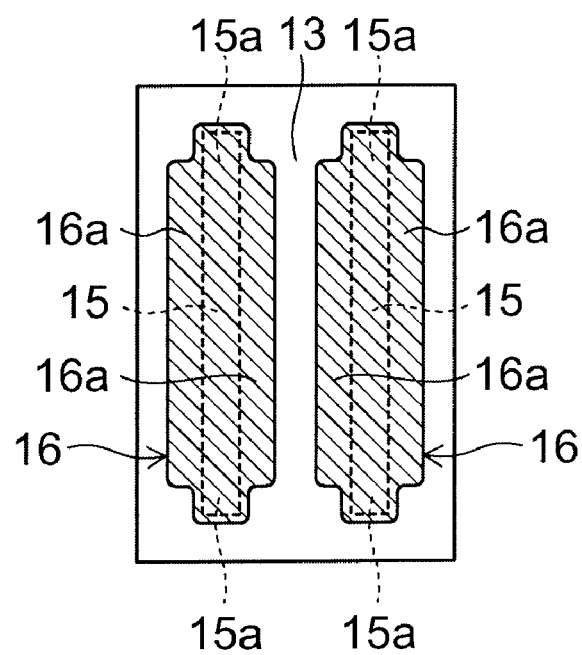

Hence, in the resist pattern end portion 15a, the crosslinking reaction of the mask material 16 is suppressed. Thus, as shown in FIG. 6B described above, the mask material crosslinked layer covering the resist pattern end portion 15a is very thin relative to the mask material sidewall portion 16a formed on the sidewall portion of the resist pattern 15. Accordingly, during etchback of the mask material for exposing the surface of the resist pattern 15, the mask material formed on the resist pattern end portion 15a is also removed simultaneously.

The etchback step for exposing the surface of the resist pattern 15 is conventionally needed to remove the resist pattern 15, which is the core pattern no longer needed after the mask material sidewall portion 16a is formed. The fact that the mask material on the resist pattern end portion can also be removed in conjunction with the etchback step reduces the number of process steps. This reduction in the number of process steps serves to prevent line width variation, defects due to particles attached during interprocess transfer, and hence yield decrease.

Figure 8:
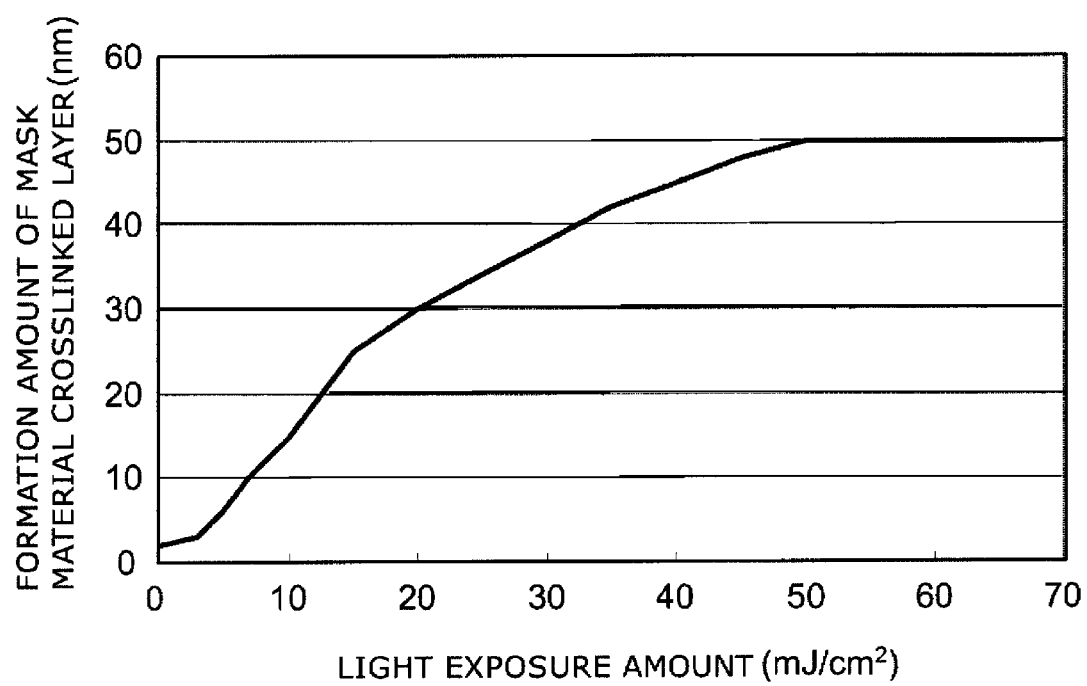
FIG. 8 is a graph showing the relationship between the amount of light exposure during the light exposure step of FIG. 5A and the amount of formation (nm) of the mask material crosslinked layer on the sidewall of the core pattern.

FIG. 8 is a graph showing the relationship between the amount of light exposure on the resist pattern 15 during the light exposure step of FIG. 5A and the amount of formation (nm) of the mask material crosslinked layer on the resist pattern 15. Here, the amount of formation of the mask material crosslinked layer is not the thickness of the mask material crosslinked layer from the foundation film, but the thickness of the mask material crosslinked layer from the resist pattern 15.

From the graph of FIG. 8, with the increase of the amount of light exposure up to a light exposure of approximately 50 mJ/cm$^2$, the amount of formation of the mask material crosslinked layer also increases. Even for a light exposure of zero, formation of the mask material crosslinked layer is not completely suppressed, but it is formed to approximately several nm because, for instance, acid generated in the exposed portion is diffused into the unexposed portion.

On the basis of the relationship of FIG. 8 as described above, the amount of light exposure in the step of FIG. 5A is adjusted so that the mask material sidewall portion 16a formed on the sidewall portion, or exposed portion, of the resist pattern 15 has a desired amount of formation (thickness). The mask material crosslinked layer formed on the shielded resist pattern end portion 15a is very thin, such as several nm. Hence, as described above, it is removed by the next etchback step. Consequently, only the mask material sidewall portion 16a is left in a line shape. Here, during the aforementioned etchback, the mask material sidewall portion 16a is slightly slimmed.

Hence, the amount of light exposure is preferably adjusted to correspond to the amount of formation slightly larger than the desired amount of formation of the mask material sidewall portion 16a.

Second Embodiment

Next, FIGS. 9 to 13 are schematic plan views showing major steps in a semiconductor device manufacturing method according to a second embodiment of the invention. Substantially the same components as those of the above first embodiment are labeled with like reference numerals.

The process up to the step of forming a resist pattern 15 having a desired line width on the carbon film 13 is the same as that of the above first embodiment. Subsequently, also in this embodiment, as shown in FIG. 9, selective light exposure of the resist pattern 15 is performed.

The selective light exposure of the resist pattern 15 in this embodiment is also the same as that in the above first embodiment in that the end portion 15a of the resist pattern 15 is shielded by a light shielding mask 21. In this embodiment, the exposed portion except the resist pattern end portion 15a is exposed with the amount of light exposure selectively varied.

Figure 9:
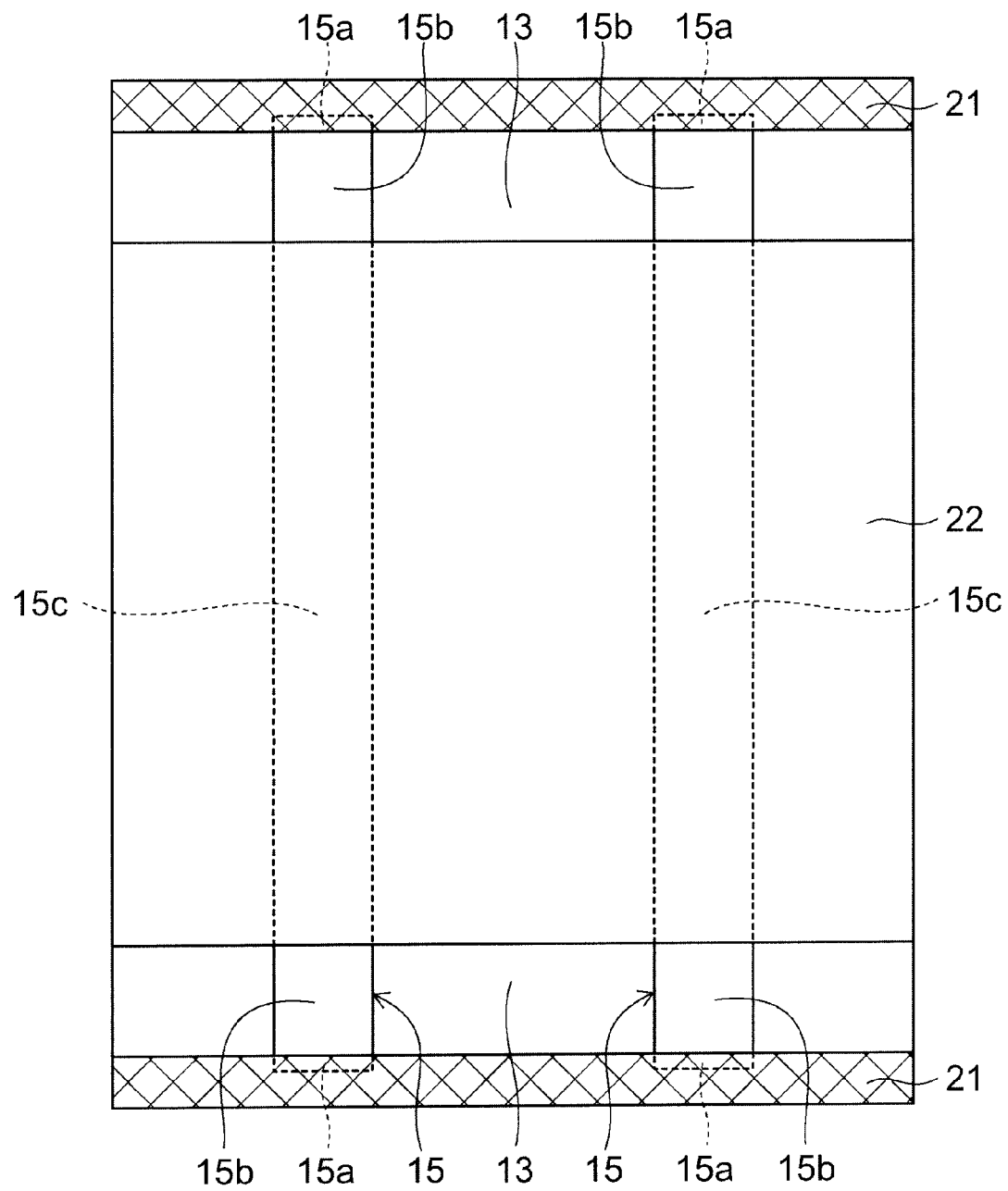
FIG. 9 is a schematic plan view showing a process step in a semiconductor device manufacturing method according to a second embodiment of the invention.

For instance, in the example shown in FIG. 9, light exposure is performed with a portion 15c of the exposed portion of the resist pattern 15 except the end portion 15a being covered with a translucent mask 22. Hence, the portion of the resist pattern 15 except the end portion 15a shielded by the light shielding mask 21 has variation in the amount of light exposure.

In the resist pattern 15, the portion 15b not covered with any of the light shielding mask 21 and the translucent mask 22 receives the largest amount of light exposure. The portion 15c covered with the translucent mask 22 receives a smaller amount of light exposure than the aforementioned portion 15b. Hence, the amount of acid generation in the portion 15c covered with the translucent mask 22 is smaller than the amount of acid generation in the portion 15b.

This selective light exposure of the resist pattern 15 is followed by the process similar to that in the above first embodiment.

Figure 10:
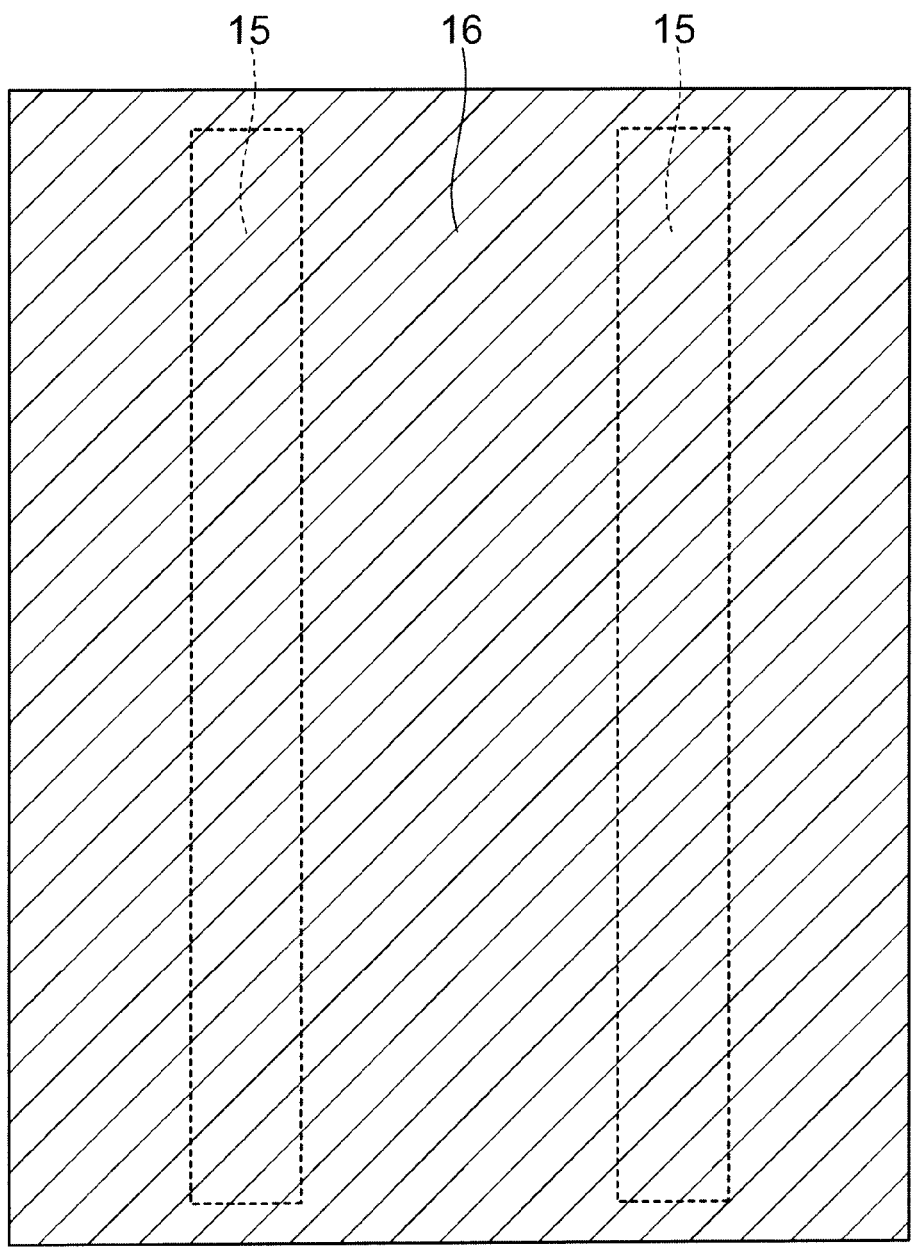
FIG. 10 is a schematic plan view showing a process step following FIG. 9.
Figure 11:
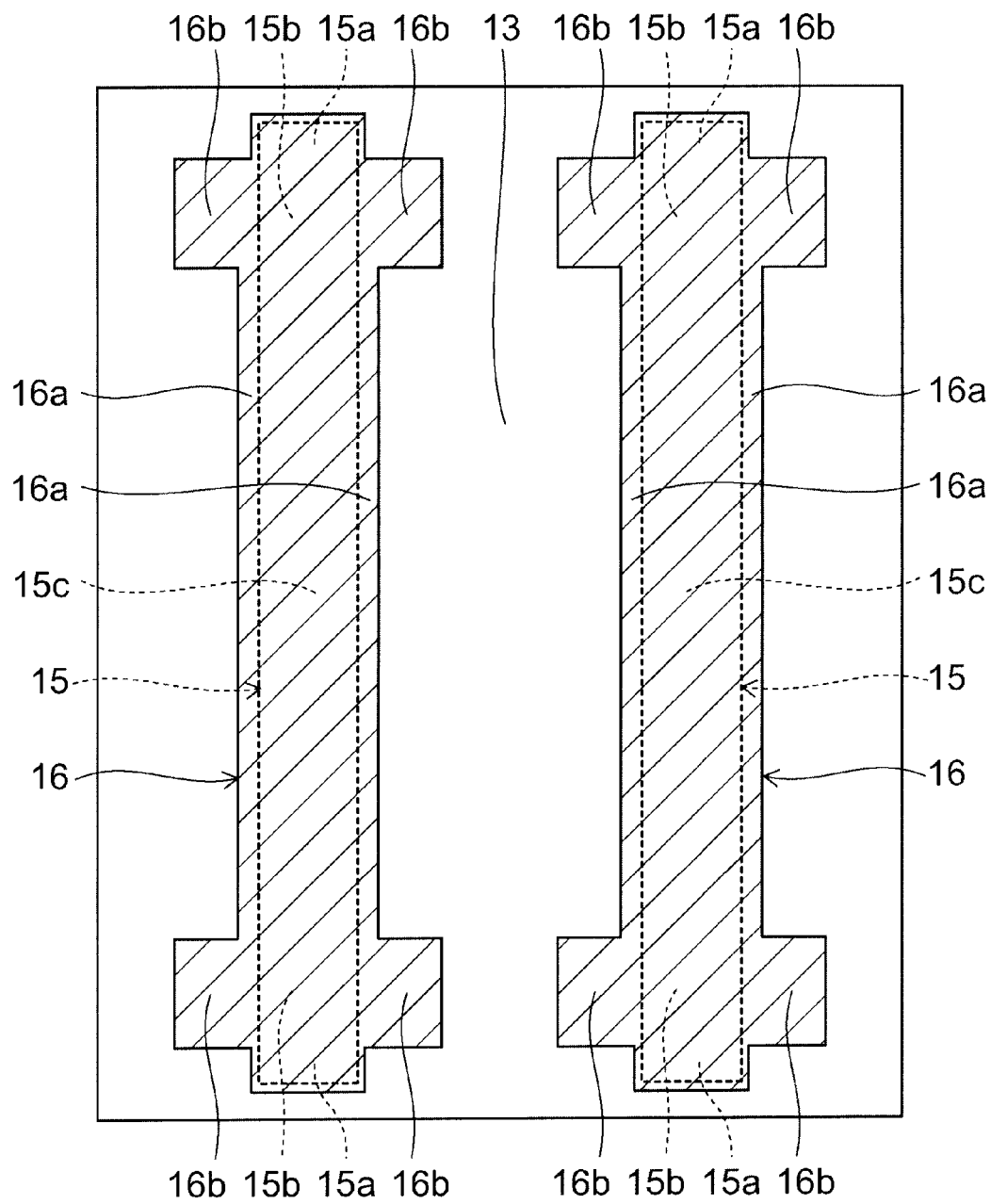
FIG. 11 is a schematic plan view showing a process step following FIG. 10.

More specifically, as shown in FIG. 10, a mask material 16 is supplied onto the carbon film 13 so as to entirely cover the resist pattern 15 including the surroundings of the resist pattern 15. The mask material 16 is applied in the liquid state with fluidity, and then cured by baking treatment. By this baking treatment, acid is supplied from the resist pattern 15 to the mask material 16, initiating a crosslinking reaction from the portion of the mask material 16 in contact with the resist pattern 15, and forming a crosslinked layer at and around the interface between the mask material 16 and the resist pattern 15.

Next, for instance, a thinner is discharged onto the mask material 16 to remove the non-crosslinked portion of the mask material 16. This leaves a mask material crosslinked layer formed on the upper surface of the resist pattern 15 and therearound as shown by hatching in FIG. 11.

Here, the amount of formation of the mask material crosslinked layer around the resist pattern 15 (the amount of protrusion to the surroundings of the resist pattern 15) depends on the amount of acid contained in the resist pattern 15. The amount of acid depends on the amount of light exposure during the aforementioned light exposure in FIG. 9.

More specifically, there is a small amount of acid in the resist pattern end portion 15*a* shielded during the light exposure, and the crosslinking reaction of the mask material 16 is suppressed in the end portion 15*a* in such a way that the resist pattern end portion 15*a* is covered with a very thin mask material crosslinked layer of several nm, for instance.

In contrast, on the sidewall of the portion of the resist pattern 15 except the end portion 15*a*, a mask material crosslinked layer is formed to a thickness corresponding to the amount of light exposure (coating thickness from the sidewall of the resist pattern 15). In this embodiment, in the aforementioned resist pattern 15, the amount of light exposure, and hence the amount of existing acid, is larger in the portion 15*b* than in the portion 15*c*. Hence, the mask material sidewall portion 16*b* formed on the sidewall of the portion 15*b* is thicker (has a larger amount of protrusion from the sidewall portion of the resist pattern 15) than the mask material sidewall portion 16*a* formed on the sidewall of the portion 15*c*.

Figure 12:
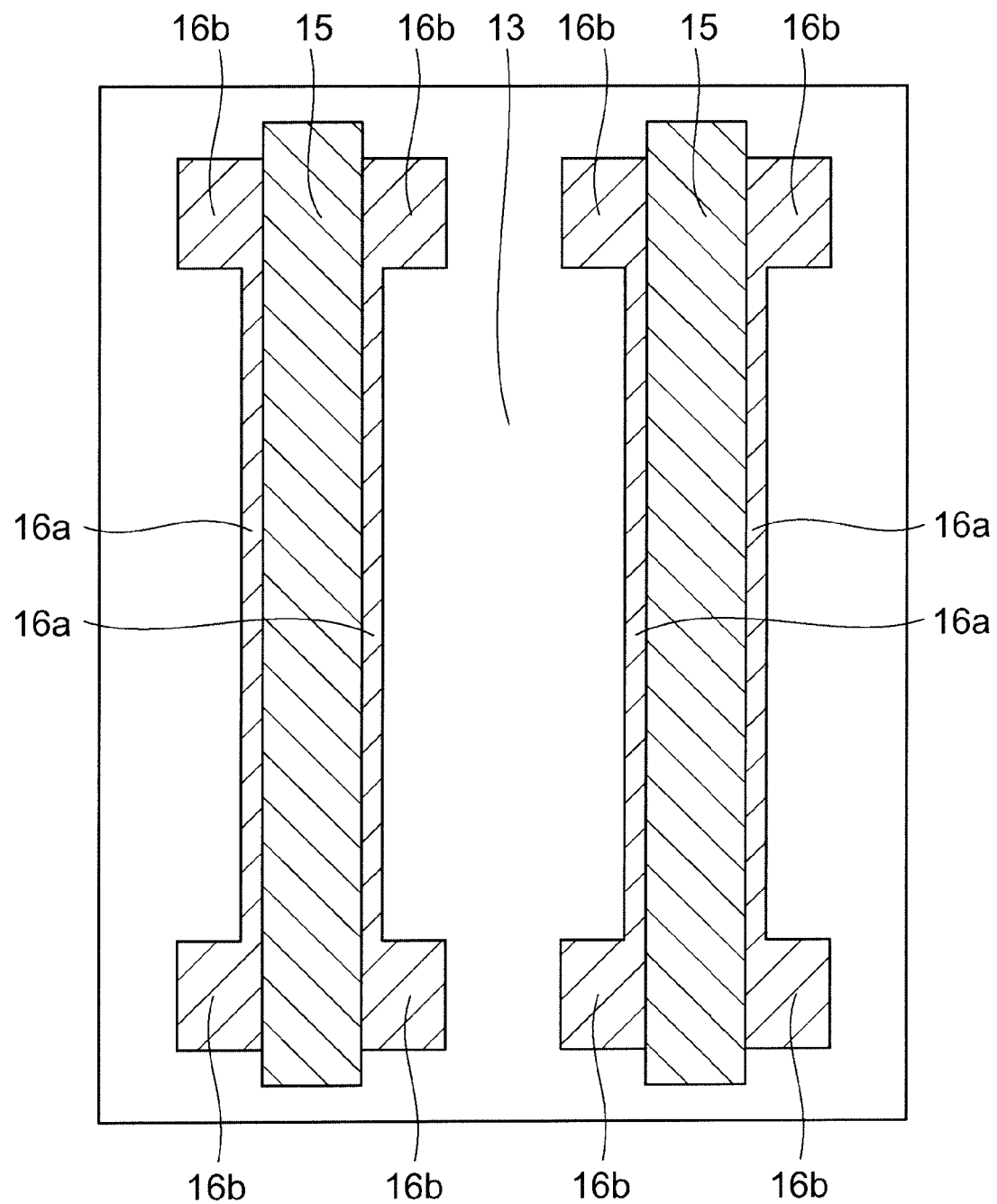
FIG. 12 is a schematic plan view showing a process step following FIG. 11.

Subsequently, a fluorocarbon-containing plasma is illustratively used to etch back the mask material crosslinked layer by approximately 20 nm to expose the surface (upper surface) of the resist pattern 15 as shown in FIG. 12. Here, the coating thickness of the mask material crosslinked layer 16 covering the surroundings of the resist pattern end portion 15*a* is very thin, such as several nm. Hence, during this etchback step, the thin portion is also slimmed and removed.

Figure 13:
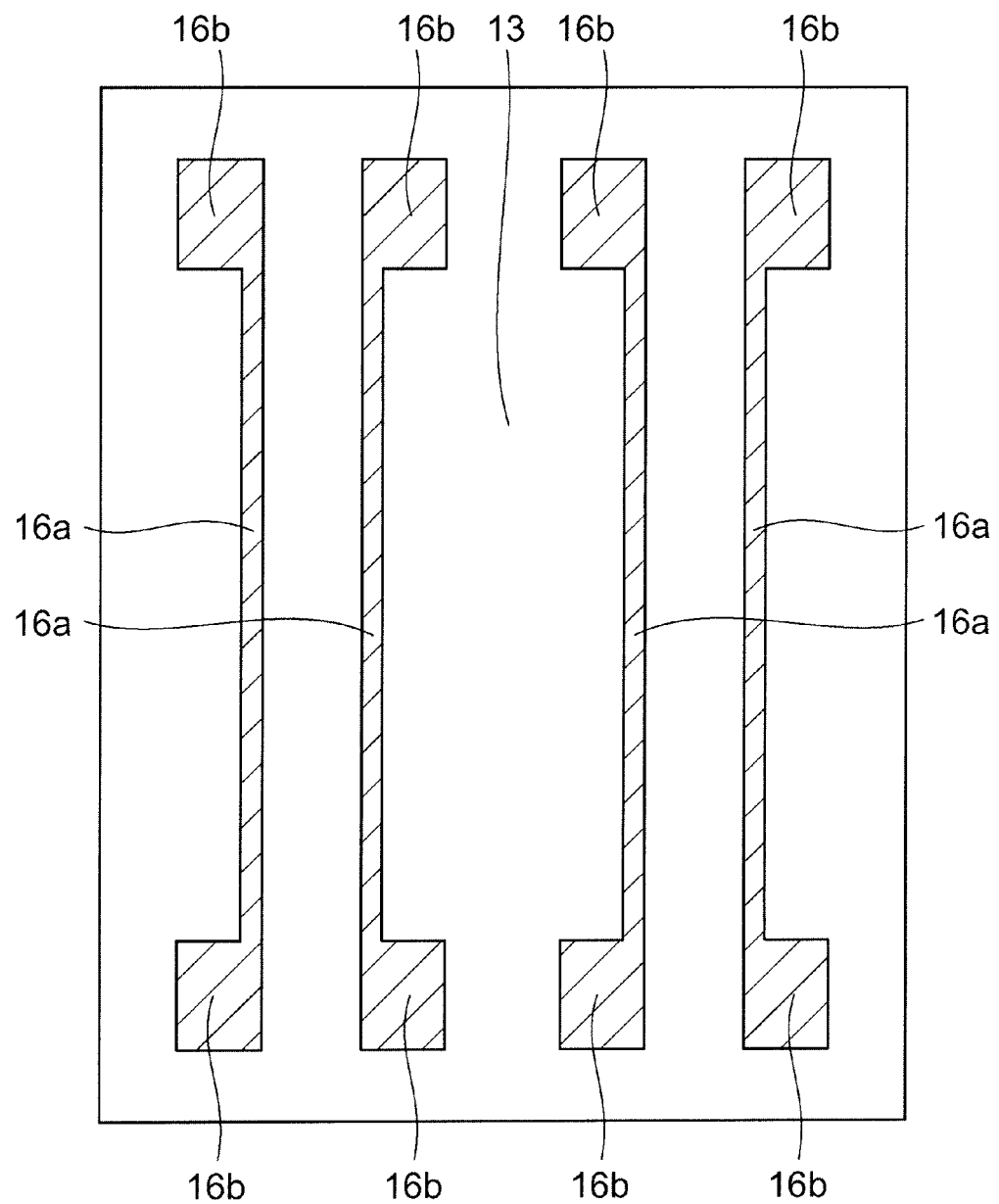
FIG. 13 is a schematic plan view showing a process step following FIG. 12.

Subsequently, the resist pattern 15 serving as the core pattern is removed. Thus, as shown in FIG. 13, a mask material sidewall portion 16*a*, 16*b* having an independent line shape is obtained without connection at the end portion.

Then, like the above first embodiment, subsequent to the removal of the resist pattern 15, the mask material sidewall portion 16*a*, 16*b* is used as a mask to continuously perform anisotropic etching on the antireflective film 14 and the carbon film 13. Thus, a carbon film pattern having the same planar pattern shape as the mask material sidewall portion 16*a*, 16*b* is obtained.

Subsequently, the mask material sidewall portion 16*a*, 16*b* is removed. Then, the carbon film pattern is used as a mask to process the silicon oxide film 12, which is the target film, by dry etching. Subsequently, the carbon film pattern is removed by the oxygen ashing process. Thus, a silicon oxide film pattern having the same planar pattern shape as the mask material sidewall portion 16*a*, 16*b* is obtained on the semiconductor substrate 11.

According to this embodiment, by selectively varying the amount of light exposure in the exposed portion of the resist pattern 15 which supplies acid to the mask material 16, the amount of acid generation in the resist pattern 15 can be partially varied. Consequently, as shown in FIG. 13, the line width can be longitudinally varied to obtain a mask material sidewall portion having an elongated portion 16*a* and pad-like portions 16*b* integrally formed at both ends of this portion 16*a*.

If the mask material sidewall portion 16*a*, 16*b* having such shape is used as a mask to pattern a semiconductor device, an interconnect pattern corresponding to the portion 16*a* can be formed simultaneously with pads (bonding pads) corresponding to the portion 16*b*.

To improve thickness controllability of the mask material crosslinked layer based on the amount of light exposure adjusted for selective light exposure of the resist pattern 15, supply of the mask material 16 onto the resist pattern 15 is preferably performed after selective light exposure of the resist pattern 15 as in the above first and second embodiment.

Third Embodiment

Figure 14A:
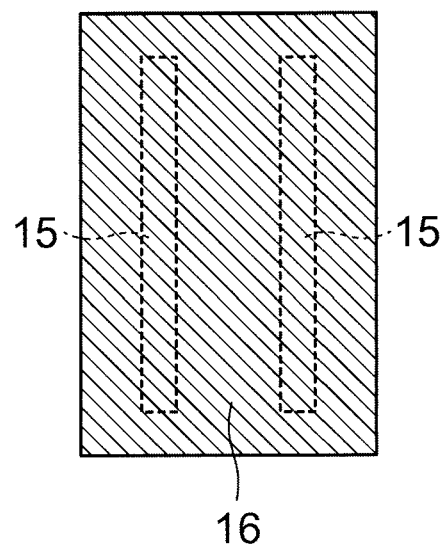
FIGS. 14A and 14B are schematic cross-sectional views showing process steps in a semiconductor device manufacturing method according to a third embodiment of the invention.

In this embodiment, a resist pattern 15 having a desired line width is formed on the carbon film 13 as shown in FIG. 4B. Then, before selective light exposure of the resist pattern 15, as shown in FIG. 14A, a mask material 16 is previously applied onto the carbon film 13 so as to entirely cover the resist pattern 15.

Figure 14B:
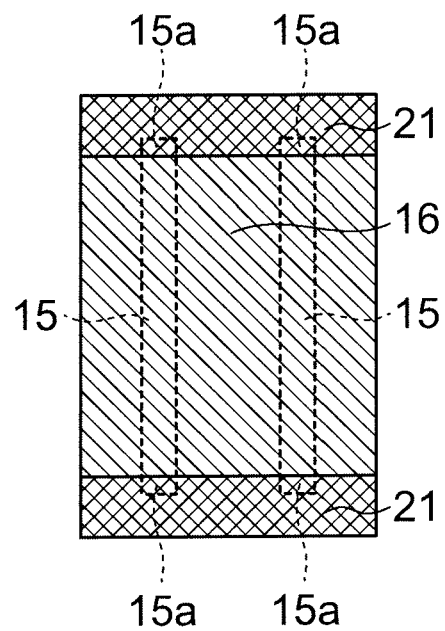

After the mask material 16 is applied, in this embodiment, as shown in FIG. 14B, in the state where the end portion 15*a* of the resist pattern 15 is shielded by a light shielding mask 21 from above the mask material 16, the portion except the end portion 15*a* is exposed to light.

Subsequently, by baking treatment, acid is supplied from the resist pattern 15 to the mask material 16, initiating a crosslinking reaction from the portion of the mask material 16 in contact with the resist pattern 15, and forming a crosslinked layer at and around the interface between the mask material 16 and the resist pattern 15.

Then, for instance, a thinner is discharged onto the mask material 16 to remove the non-crosslinked portion of the mask material 16. This leaves a mask material crosslinked layer formed on the upper surface of the resist pattern 15 and therearound as shown by hatching in FIG. 6B.

The subsequent process is continued like the above first embodiment. By etchback of the mask material 16, the mask material crosslinked layer formed on the resist pattern end portion 15*a* is removed, and the mask material sidewall portion 16*a* is left. This mask material sidewall portion 16*a* is used as a mask to continue processing on the carbon film and the like.

The embodiments of the invention have been described with reference to examples. However, the invention is not limited thereto, but can be variously modified within the spirit of the invention.

In the above embodiments, a carbon film and an organic antireflective film are formed on a silicon oxide film, which is a target film on a semiconductor substrate. Then, a resist pattern serving as a core pattern is formed, and a mask material is supplied further thereon. However, the carbon film and the organic antireflective film are not necessarily needed.

For instance, in the case of using a mask material having sufficient etching selectivity with respect to the target film, a core pattern and a mask material sidewall portion can be directly formed on the target film, and the mask material sidewall portion remaining after removal of the core pattern can be used as a mask to directly process the target film. In this case, at any rate, sufficient etching selectivity is needed between the core pattern and the mask material.

The invention claimed is:

1. A semiconductor device manufacturing method comprising:
   forming a core pattern on a foundation film, the core pattern containing a material generating acid by light exposure;
   selectively exposing part of the core pattern to light;
   supplying a mask material onto the foundation film so as to cover the core pattern, the mask material being crosslinkable upon supply of acid;
   removing part of the mask material to expose an upper surface of the core pattern and remove the mask material formed around an unexposed region of the core pattern, thereby leaving a mask material sidewall portion formed on a sidewall of the core pattern; and
   removing the core pattern and processing the foundation film by using the mask material sidewall portion left on the foundation film as a mask,
   wherein the selectively exposing the part of the core pattern to light includes selectively exposing a region of the core pattern except its end portion to light.

2. The manufacturing method according to claim 1, wherein the core pattern is formed in a line shape.

3. The manufacturing method according to claim 1, wherein the forming the core pattern includes:
   forming a resist film on the foundation film; and
   performing light exposure and development on the resist film to pattern the resist film.

4. The manufacturing method according to claim 3, wherein
   the resist film is a positive resist, and
   the core pattern is an unexposed portion of the resist film left on the foundation film after the development.

5. The manufacturing method according to claim 1, wherein the forming the core pattern is followed by a slimming process in which a line width of the core pattern is thinned using a chemical liquid.

6. The manufacturing method according to claim 1, wherein the forming the core pattern is followed by a slimming process in which a line width of the core pattern is thinned by dry etching.

7. The manufacturing method according to claim 1, wherein the selective light exposure of the core pattern is followed by baking treatment.

8. The manufacturing method according to claim 1, wherein the selective light exposure of the core pattern is followed by supplying the mask material on the foundation film.

9. The manufacturing method according to claim 1, wherein the mask material contains silicon.

10. The manufacturing method according to claim 1, wherein the core pattern is removed by using an oxygen-containing plasma.

11. The manufacturing method according to claim 1, wherein an amount of light exposure on the exposed portion of the core pattern is selectively varied.

12. A semiconductor device manufacturing method comprising:
   forming a core pattern on a foundation film, the core pattern containing a material generating acid by light exposure;
   selectively exposing part of the core pattern to light;
   supplying a mask material onto the foundation film so as to cover the core pattern, the mask material being crosslinkable upon supply of acid;
   removing part of the mask material to expose an upper surface of the core pattern and remove the mask material formed around an unexposed region of the core pattern, thereby leaving a mask material sidewall portion formed on a sidewall of the core pattern; and
   removing the core pattern and processing the foundation film by using the mask material sidewall portion left on the foundation film as a mask,
   the method further comprising:
   before the removing part of the mask material, causing a portion of the mask material in contact with the core pattern to crosslink by supply of acid from the core pattern, and then removing a non-crosslinked portion of the mask material.

13. The manufacturing method according to claim 12, wherein the non-crosslinked portion of the mask material is removed by supplying a thinner onto the mask material.

14. The manufacturing method according to claim 12, wherein the mask material is supplied in a liquid state onto the foundation film, and then cured by baking treatment.

15. The manufacturing method according to claim 14, wherein acid is supplied from the core pattern to the mask material by the baking treatment.

16. The manufacturing method according to claim 12, wherein the crosslinked portion of the mask material formed around the unexposed region of the core pattern has a smaller thickness than the crosslinked portion of the mask material formed on the sidewall of the core pattern.

17. The manufacturing method according to claim 16, wherein the upper surface of the core pattern is exposed by etching back the crosslinked portion of the mask material.

18. The manufacturing method according to claim 17, wherein during the etching back, the crosslinked portion of the mask material formed around the unexposed region of the core pattern is also removed.

19. A semiconductor device manufacturing method comprising:
   forming a core pattern on a foundation film, the core pattern containing a material generating acid by light exposure;
   selectively exposing part of the core pattern to light;
   supplying a mask material onto the foundation film so as to cover the core pattern, the mask material being crosslinkable upon supply of acid;
   removing part of the mask material to expose an upper surface of the core pattern and remove the mask material formed around an unexposed region of the core pattern, thereby leaving a mask material sidewall portion formed on a sidewall of the core pattern; and
   removing the core pattern and processing the foundation film by using the mask material sidewall portion left on the foundation film as a mask,
   wherein the mask material is supplied onto the foundation film before selectively exposing the core pattern to light.

* * * * *